United States Patent
Tanaka et al.

(10) Patent No.: US 10,762,956 B2
(45) Date of Patent: Sep. 1, 2020

(54) SEMICONDUCTOR MEMORY DEVICE

(71) Applicant: TOSHIBA MEMORY CORPORATION, Tokyo (JP)

(72) Inventors: Chika Tanaka, Fujisawa Kanagawa (JP); Masumi Saitoh, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,408

(22) Filed: Mar. 2, 2018

(65) Prior Publication Data
US 2019/0096481 A1 Mar. 28, 2019

(30) Foreign Application Priority Data
Sep. 22, 2017 (JP) .................. 2017-181969

(51) Int. Cl.
*G11C 5/06* (2006.01)
*G11C 13/00* (2006.01)
(Continued)

(52) U.S. Cl.
CPC ........ *G11C 13/0007* (2013.01); *G11C 13/004* (2013.01); *G11C 13/0011* (2013.01); *G11C 13/0026* (2013.01); *G11C 13/0038* (2013.01); *G11C 13/0069* (2013.01); *H01L 23/528* (2013.01); *H01L 27/249* (2013.01); *H01L 27/2436* (2013.01); *H01L 27/2454* (2013.01); *H01L 45/04* (2013.01); *H01L 45/1226* (2013.01); *H01L 45/1253* (2013.01);
(Continued)

(58) Field of Classification Search
CPC ............ G11C 13/0007; G11C 12/0011; G11C 13/0026; G11C 13/0038; G11C 13/004; G11C 13/0069; H01L 23/528; H01L 27/436; H01L 27/2454
USPC ........................................................ 365/148
See application file for complete search history.

(56) References Cited

U.S. PATENT DOCUMENTS 6,954,386 B2   10/2005   Narui et al.
8,072,823 B2   12/2011   Aihara et al.
(Continued)

FOREIGN PATENT DOCUMENTS

JP     4257064 B2    4/2009
JP     2011-40706 A  2/2011
(Continued)

*Primary Examiner* — Viet Q Nguyen
(74) *Attorney, Agent, or Firm* — Kim & Stewart LLP (57) ABSTRACT

A semiconductor memory device includes a substrate, a stacked body comprising a plurality of first conductors extending in a first direction away from a surface of the substrate and spaced from one another in second and third directions intersecting the first direction and each other, the stacked body having a first region and a second region, a plurality of second conductors extending in the second direction, a plurality of third conductors extending in the third, each third conductor connected to a first end, in the second direction, of a plurality of second conductors in the first region, a plurality of fourth connectors extending in the first direction, each fourth conductor connected to the plurality of second conductors in the second region, and memory cells located between adjacent surfaces of the first and second conductors in the first region.

9 Claims, 12 Drawing Sheets

(51) Int. Cl.
*H01L 27/24* (2006.01)
*H01L 45/00* (2006.01)
*H01L 23/528* (2006.01)

(52) U.S. Cl.
CPC ........ *H01L 45/1266* (2013.01); *H01L 45/145* (2013.01); *H01L 45/146* (2013.01); *H01L 45/16* (2013.01); *H01L 45/1616* (2013.01); *H01L 45/1683* (2013.01); *G11C 2013/0045* (2013.01); *G11C 2213/32* (2013.01); *G11C 2213/52* (2013.01); *G11C 2213/71* (2013.01); *G11C 2213/72* (2013.01); *G11C 2213/75* (2013.01); *G11C 2213/79* (2013.01)

(56) References Cited

U.S. PATENT DOCUMENTS

| | | | |
|---|---|---|---|
| 8,169,826 B2 * | 5/2012 | Hishida | G11C 5/02 |
| | | | 257/324 |
| 9,275,729 B2 * | 3/2016 | Ota | G11C 13/0026 |
| 9,349,446 B2 * | 5/2016 | Murooka | G11C 13/0002 |
| 9,825,096 B2 * | 11/2017 | Ota | H01L 27/2454 |
| 9,975,570 B2 * | 5/2018 | Collier-Hallman | B62D 5/046 |
| 10,038,032 B2 * | 7/2018 | Sakuma | H01L 29/66666 |
| 10,050,087 B1 * | 8/2018 | Kabuyanagi | H01L 45/1608 |
| 10,147,874 B2 * | 12/2018 | Saitoh | H01L 45/085 |
| 10,249,818 B1 * | 4/2019 | Yamaguchi | G11C 11/221 |
| 10,256,404 B2 * | 4/2019 | Tachikawa | H01L 45/146 |
| 10,312,289 B1 * | 6/2019 | Ota | H01L 27/2454 |
| 10,418,551 B2 * | 9/2019 | Tanaka | H01L 27/2436 |
| 10,446,749 B1 * | 10/2019 | Yoshimura | G11C 13/0007 |
| 2010/0046286 A1 * | 2/2010 | Choi | G11C 7/12 |
| | | | 365/163 |

FOREIGN PATENT DOCUMENTS

| | | |
|---|---|---|
| JP | 5264611 B2 | 8/2013 |
| JP | 2015-141726 A | 8/2015 |
| JP | 2016-58127 A | 4/2016 |

* cited by examiner

SEMICONDUCTOR MEMORY DEVICE

CROSS-REFERENCE TO RELATED APPLICATION

This application is based upon and claims the benefit of priority from Japanese Patent Application No. 2017-181969, filed Sep. 22, 2017, the entire contents of which are incorporated herein by reference.

FIELD

Embodiments described herein relate generally to a semiconductor memory device.

BACKGROUND

As the integration density of a semiconductor memory device increases, a semiconductor memory device has been developed having memory cells three-dimensionally arranged therein. In such a semiconductor memory device, for example, a so-called ReRAM, in which a resistance-variable element for reversibly changing a resistance value is used as a memory cell, or a so-called flash memory, in which a field-effect transistor capable of accumulating charges in a gate insulating layer is used as a memory cell, is known. A semiconductor memory device, in which the resistance-variable elements are three-dimensionally arranged, includes, for example, a plurality of word lines extending in an X direction and spaced from one another in a Z direction and a Y direction, a plurality of local bit lines extending in the Z direction and respectively provided between the word lines adjacent to each other in the Y direction, and a variable resistance layer provided between the word lines and the local bit line. In addition, one end in the Z direction of the plurality of local bit lines are connected to global bit lines through selection transistors, respectively. Further, one end of the global bit line is connected to a circuit for supplying power to the global bit line.

When a read operation is performed in such a semiconductor memory device, the global bit line may be charged. However, as the integration density of a semiconductor memory device increases, the time required for charging the global bit line is increasing.

DETAILED DESCRIPTION

Embodiments provide a semiconductor memory device that operates at high speed.

In general, according to one embodiment, a semiconductor memory device includes a substrate, a stacked body comprising a plurality of first conductors extending in a first direction away from a surface of the substrate, the first conductors spaced from one another in a second direction intersecting the first direction and a third direction intersecting the first and the second directions, the stacked body comprising a first region and a second region spaced from one another in the third direction, a plurality of second conductors extending in the second direction and spaced from one another in the first and third directions, a plurality of third conductors, extending in the third direction and spaced from one another in the first direction, each third conductor connected to a first end, in the second direction, of a plurality of second conductors in the first region, a plurality of fourth connectors, extending in the first direction and spaced from one another in the second direction, each fourth conductor connected to the plurality of second conductors in the second region, and memory cells located between adjacent surfaces of the first and second conductors in the first region.

A semiconductor memory device according to an embodiment will be described in detail below with reference to the drawings. The following embodiment is merely example and is not intended to limit the disclosure.

In the following description, a main surface (front surface) of a substrate is an upper surface, a direction intersecting the upper surface of the substrate is referred to as a first direction, a direction intersecting with the first direction is referred to as a second direction, and a direction intersecting with the first direction and the second direction is referred to as a third direction. In addition, a direction away from the substrate in the first direction is referred to as an upward direction, and a direction approaching the substrate in the first direction is referred to as a downward direction. The upper surface mentioned in any configuration is referred to as an upward surface of this configuration, and a lower surface mentioned in any configuration is referred to as a downward surface of this configuration. A plane intersecting with the second direction or the third direction is referred to as a side surface. Further, a predetermined direction parallel to the upper surface of the substrate is referred to an X direction, a direction parallel to the upper surface of the substrate and perpendicular to the X direction is referred to as a Y direction, and a direction perpendicular to the upper surface of the substrate is referred to as a Z direction. In the following description, a case where the first direction, the second direction, and the third direction respectively coincide with the Z direction, the Y direction, and the X direction is exemplified, but the first direction, the second direction, and the third direction may not coincide with the Z direction, the Y direction, and the X direction.

In the following description, the term "memory cell" refers to an element capable of storing data of 1 bit or more, such as a resistance-variable element which reversibly changes a resistance value, a resistance-variable element having a rectifying characteristic, or a field-effect transistor capable of accumulating charges in a gate insulating layer.

First Embodiment

[Configuration]

Figure 1:
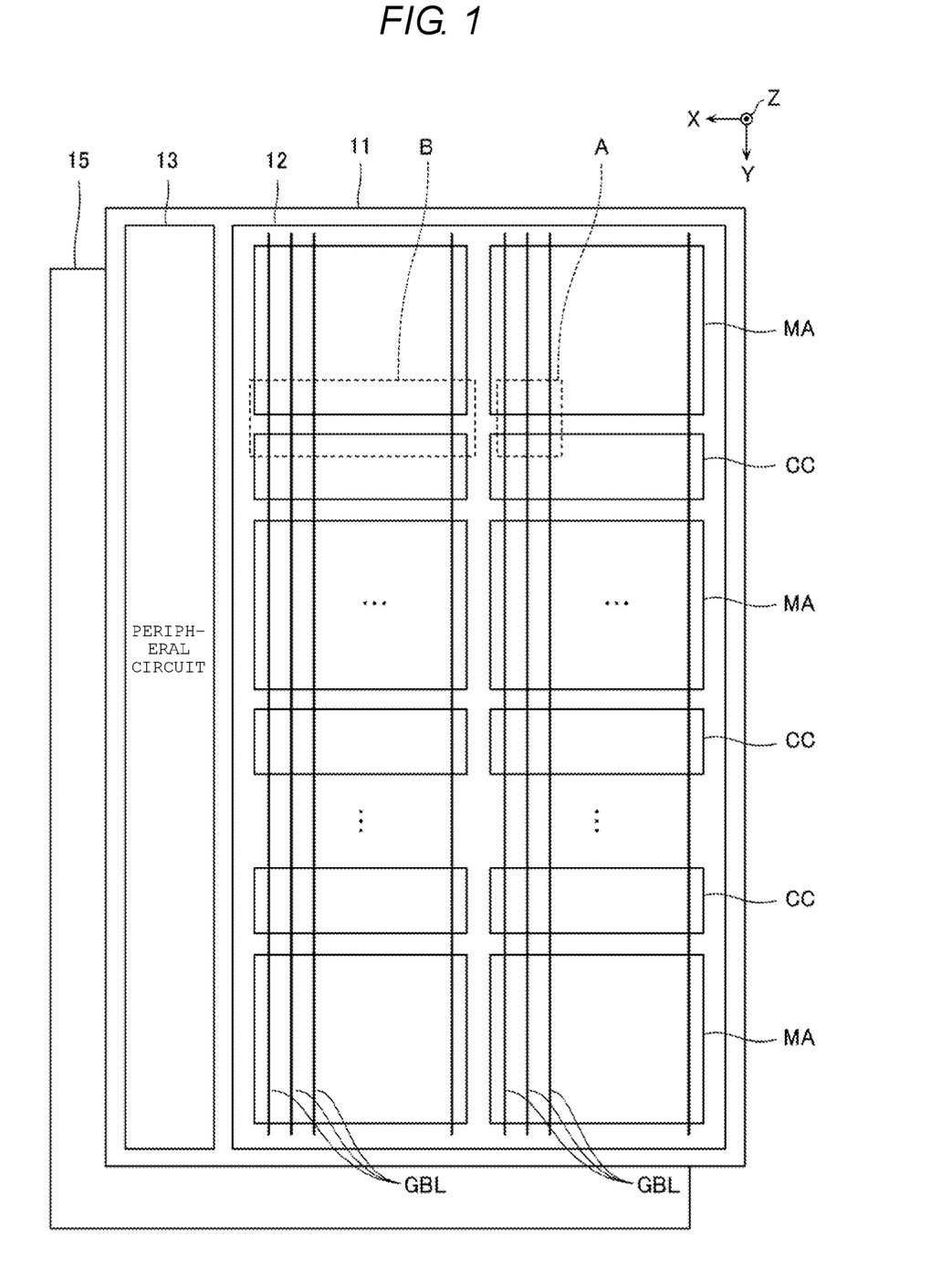
FIG. 1 is a schematic plan view of a semiconductor memory device according to a first embodiment.

FIG. 1 is a schematic plan view of a semiconductor memory device according to a first embodiment.

The semiconductor memory device according to the embodiment includes a memory die 11 and a control die 15. The memory die 11 includes a core portion 12 which is provided with a memory cell array MA and a peripheral circuit 13 which is provided around the core portion 12. The control die 15 includes a control circuit which controls the memory cell array MA and the like via the peripheral circuit 13 on the memory die 11.

The core portion 12 includes a plurality of global bit line GBL spaced from one another in the X direction and extending in the Y direction, a plurality of memory cell arrays MA spaced from one another in the X direction, and in the Y direction along the global bit lines GBL, and a plurality of charging circuits CC respectively provided between memory cell arrays MA adjacent to each other in the Y direction.

Sets of the global bit lines GBL are commonly connected to a plurality of memory cell arrays MA and the plurality of charging circuits CC. In addition, the global bit line GBL is connected to a sense amplifier and a column decoder (not illustrated, respectively) provided in the peripheral circuit 13.

The memory cell array MA includes a plurality of memory cells (not illustrated). Each of these memory cells stores one bit of data, for example. The memory cell array MA includes a plurality of memory cells that together store data of one page. These memory cells are connected to the global bit lines GBL under the control of the peripheral circuit 13.

The charging circuit CC is connected to a voltage generation circuit provided in the peripheral circuit 13. The charging circuit CC supplies charge supplied from the voltage generation circuit to the global bit lines GBL under the control of the peripheral circuit 13, thereby charging the global bit lines GBL.

In the example illustrated in FIG. 1, the semiconductor memory device includes the memory die 11 and the control die 15, and the control circuit is provided on the control die 15. However, for example, the control die 15 may not be provided, and the control circuit may be formed directly on the memory die 11. In addition, the control circuit may be provided exteriorly of the semiconductor memory device.

Figure 2:
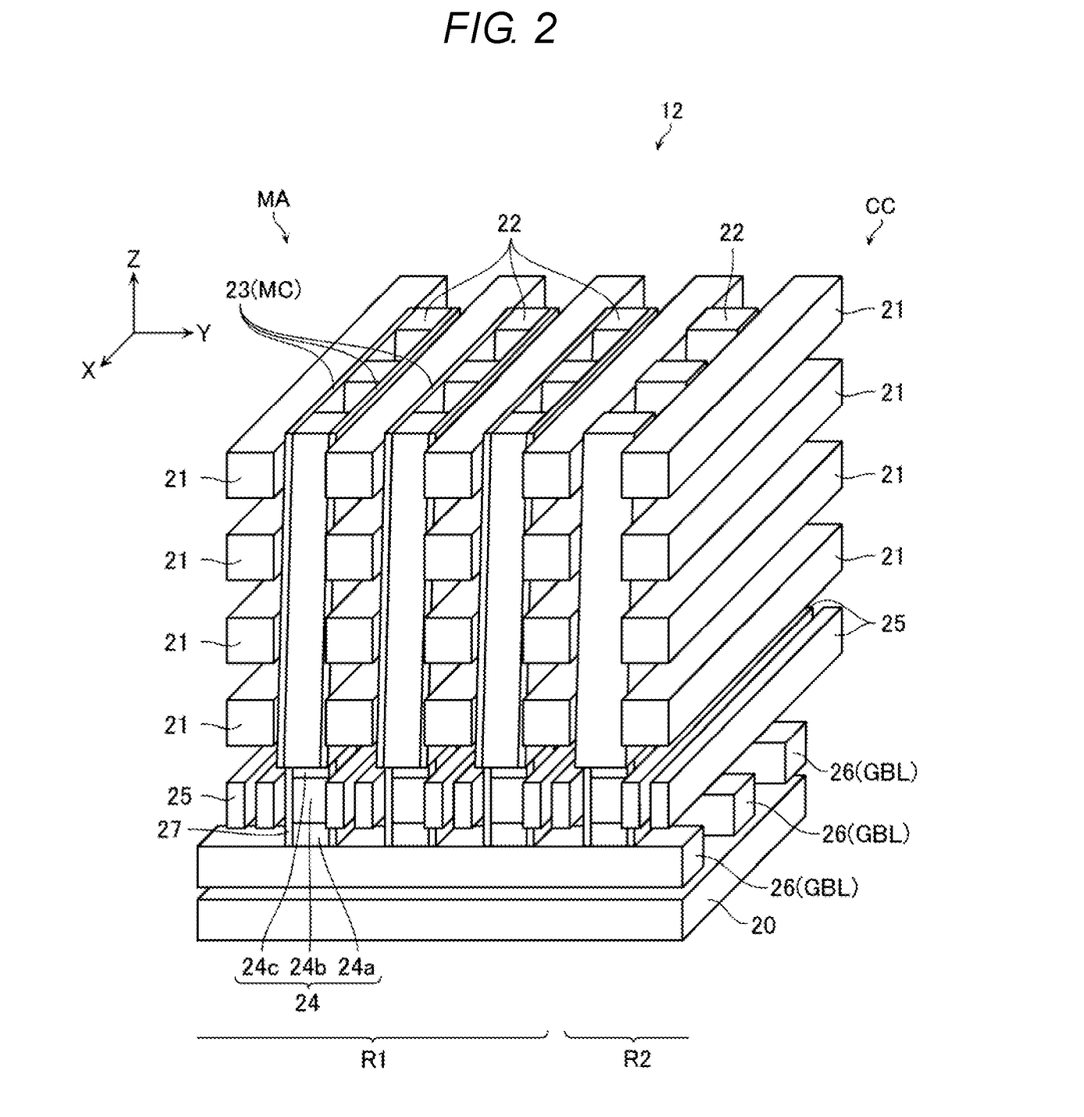
FIG. 2 is a schematic perspective view of a portion indicated by A in FIG. 1.
Figure 3:
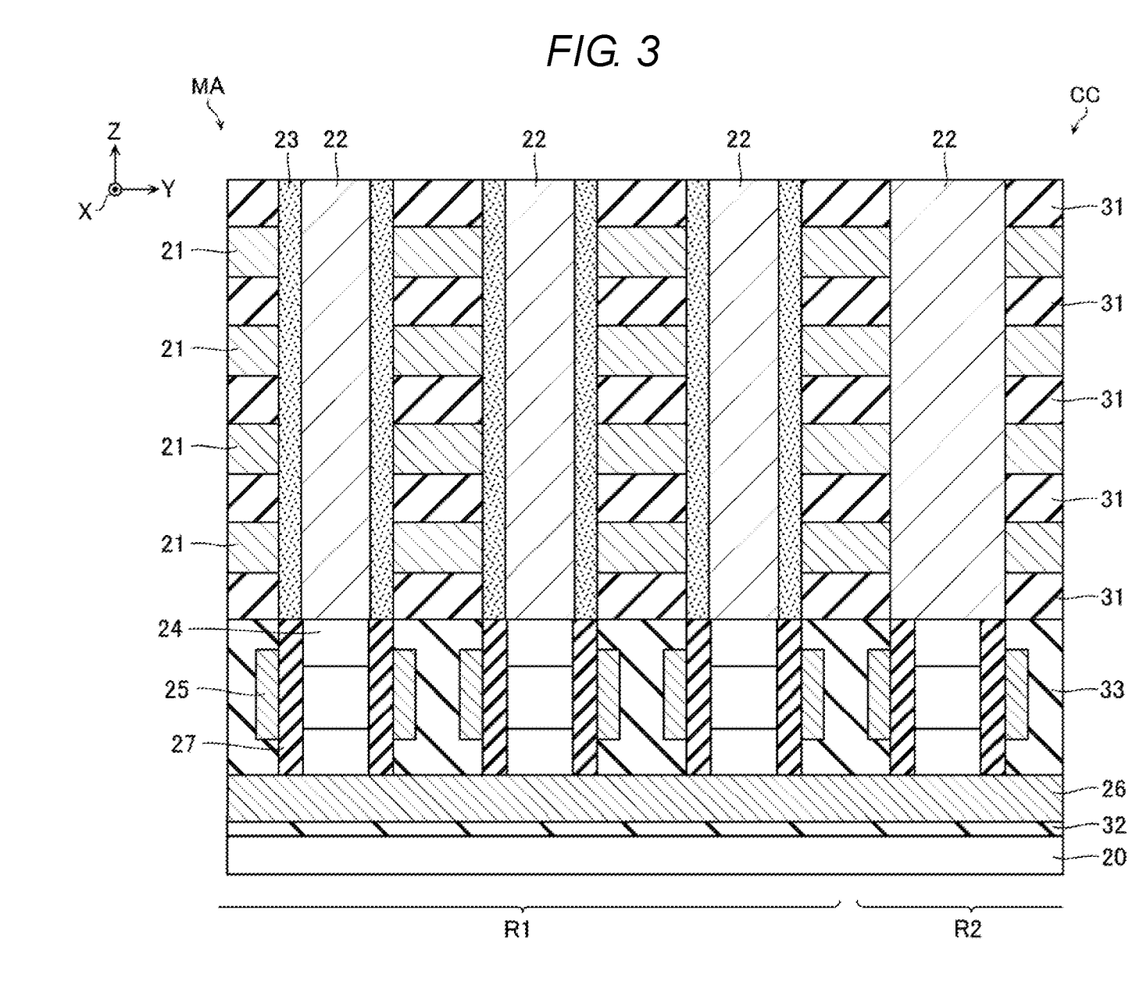
FIG. 3 is a schematic cross-sectional view of a configuration illustrated in FIG. 2 when viewed in an X direction.
Figure 4:
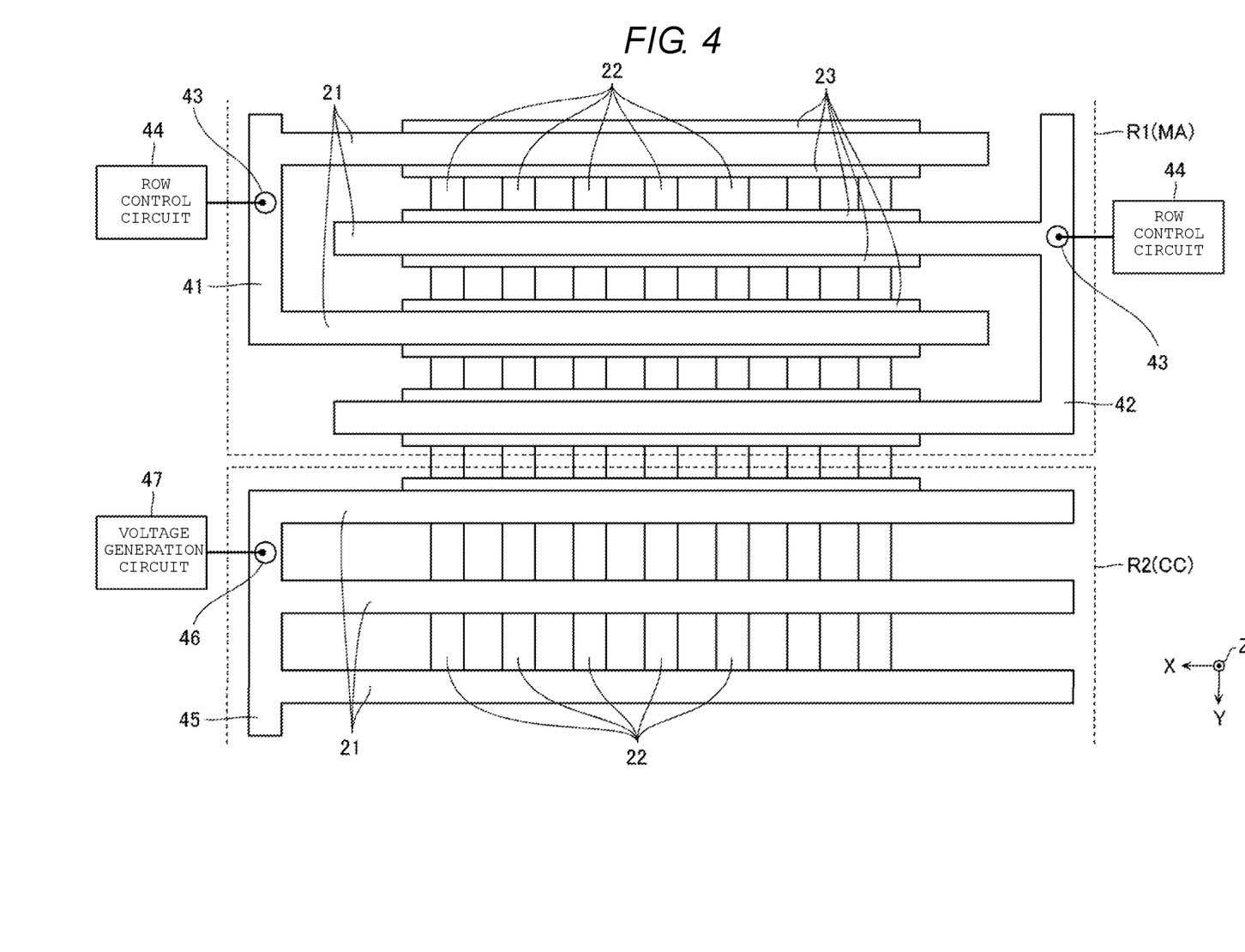
FIG. 4 is a plan view corresponding to a portion indicated by B in FIG. 1.

FIG. 2 is a schematic perspective view illustrating a configuration of a boundary portion (a portion indicated by A in FIG. 1) between the memory cell array MA and the charging circuit CC in the core portion 12. FIG. 3 is a schematic cross-sectional view of the configuration illustrated in FIG. 2 when viewed in the X direction. FIG. 4 is a plan view of a structure corresponding to the structure illustrated in FIG. 2 when viewed in the Z direction, and corresponds to a portion indicated by B in FIG. 1.

As illustrated in FIG. 2, the core portion 12 includes a plurality of first interconnects 21 provided above a substrate 20, a plurality of second interconnects 22 extending across the sides of the plurality of first interconnects 21, variable resistance layers 23 provided between the crossing locations of the plurality of first interconnects 21 and second interconnects 22, a plurality of semiconductor layers 24 connected to one end of the plurality of second interconnects 22, a plurality of gate electrodes 25 facing these plurality of semiconductor layers 24, and a plurality of third interconnects 26 connected to one end of the plurality of semiconductor layers 24.

The first interconnects 21 extend in the X direction, and are spaced from one another in the Z direction and the Y direction at a predetermined pitch. The first interconnect 21 contains a conductive material such as polysilicon (p-Si), tungsten (W), or titanium nitride (TiN). Further, the first interconnect 21 may include two types of conductive layers having different work functions and an insulating layer provided between the conductive layers, and may have a rectifying function.

The second interconnects 22 extend between the first interconnects 21 adjacent to each other in the Y direction, in the Z direction. The second interconnects 22 are spaced from one another in the Y direction and the X direction at a predetermined pitch. In other words, the second interconnects 22 are provided alternately with the first interconnects 21 in the Y direction. Similarly to the first interconnect 21, the second interconnect 22 contains a conductive material.

The variable resistance layer 23 is provided between the crossing locations of the first interconnect 21 and the second interconnect 22. The variable resistance layer 23 is a layer capable of reversibly changing its resistance value. The variable resistance layer 23 according to the embodiment is, for example, an insulating layer including a current path (filament) between the first interconnect 21 and the second interconnect 22. The current path reversibly appears or disappears based on the potential difference between the first interconnect 21 and the second interconnect 22. A material of the variable resistance layer 23 may be, for example, a stacked body of a metal layer such as copper (Cu) or silver (Ag) and an insulating layer such as a silicon oxide ($SiO_2$), may be a transition metal oxide such as a hafnium oxide (HfOx), or may be other materials. The variable resistance layer 23 may be one which reversibly changes a resistance value by a reversible change in crystal structure thereof. Further, the variable resistance layer 23 may extend in the X direction and/or the Z direction along a side surface in the Y direction of the first interconnect 21 or the second interconnect 22, for example, and may be divided in these directions.

The semiconductor layer 24 is provided between a lower end of the second interconnect 22 and an upper surface of the third interconnect 26, and are spaced from one another in the Y direction and the X direction at a predetermined pitch. The semiconductor layer 24 includes an n-type semiconductor layer 24a, a p-type semiconductor layer 24b, and an n-type semiconductor layer 24c provided in this order from the location of the third interconnect 26. These layers are formed of polysilicon (p-Si) or the like into which an n-type impurity, a p-type impurity, or a p-type impurity and an n-type impurity are implanted. On both side surfaces of the semiconductor layer 24, gate insulating layers 27 extending in the X direction are provided.

The gate electrodes 25 extend in the X direction, and are spaced from one another in the Y direction. A gate electrode 25 is located on both sides of the n-type semiconductor layer 24a, the p-type semiconductor layer 24b, and the n-type semiconductor layer 24c with the gate insulating layer 27 therebetween. The gate electrode 25 contains a conductive material similar to that of the first interconnect 21. The shape of the gate electrode 25 may be appropriately changed. For example, as illustrated in the example in the drawing, two conductive layers 24 extending in the X direction are provided between a pair of semiconductor layers 24 adjacent to each other in the Y direction, which may be used as the gate electrode 25, and one conductive layer may be provided between a pair of semiconductor layers 24 adjacent to each other in the Y direction. In addition, the gate electrode 25 may cover side surfaces of the semiconductor layer 24 in the X direction and the Y direction.

The third interconnects 26 extend in the Y direction and are spaced from each other in the X direction at a predetermined pitch. The third interconnect 26 functions as a global bit line GBL. The third interconnect 26 contains a conductive material, similar to that of the first interconnect 21.

As illustrated in FIG. 3, interlayer insulating layers 31, 32, and 33 formed of silicon oxide ($SiO_2$) are disposed between these components.

In the embodiment, a part of the core portion 12 configured as described above functions as the memory cell array MA, and the other part functions as the charging circuit CC. Hereinafter, a region where the memory cell array MA is provided is referred to as "first region R1", and a region where the charging circuit CC is provided is referred to as "second region R2".

In the first region R1, the variable resistance layer 23 is provided between the first interconnect 21 and the second interconnect 22. Therefore, the second surface of the interconnect 22 faces a plurality of first interconnects 21, with the variable resistance layer 23 interposed therebetween. In the second region R2, in contrast, the variable resistance layer 23 is not provided between the first interconnect 21 and the second interconnect 22. Therefore, the second interconnects 22 are in contact with the plurality of first interconnects 21 without the variable resistance layer 23 being interposed therebetween.

In the first region R1, as illustrated in FIG. 4, a fourth interconnect 41 extending in the Y direction is provided on one end side, in the X direction, of the first interconnect 21, and the fourth interconnect 41 is commonly connected with odd-numbered first interconnects 21 spaced from one another in the Y direction. Further, a fifth interconnect 42 extending in the Y direction is provided on the other end side, in the X direction, of the first interconnect 21, and the fifth interconnect 42 is commonly connected with even-numbered first interconnects 21 spaced from one another in the Y direction. Although not illustrated, similarly to the interconnect 21, a plurality of fourth interconnects 41 and a plurality of fifth interconnects 42 are stacked in the Z direction. The plurality of fourth interconnects 41 and the plurality of fifth interconnects 42 are connected to contacts 43, and are connected to a row control circuit 44 in the peripheral circuit 13 (see FIG. 1) through the contacts 43.

In contrast, in the second region R2, a sixth interconnect 45 extending in the Y direction is provided on one end side or the other end side in the X direction of the first interconnect 21, and the sixth interconnect 45 is commonly connected with all the first interconnects 21 in the second region R2. Although not illustrated, similarly to the first interconnect 21, a plurality of sixth interconnects 45 are also stacked in the Z direction. In the embodiment, the uppermost interconnect (interconnect farthest from the substrate 20) among the plurality of sixth interconnect 45 stacked in the Z direction is connected to the contact 46, and is connected to the voltage generation circuit 47 in the peripheral circuit 13 (see FIG. 1) through the contact 46. On the other hand, the other sixth interconnects 45 are not connected to the peripheral circuit 13.

In the embodiment, the first interconnect 21 disposed in the first region R1 and the first interconnect 21 disposed in the second region R2 are adjacent to each other at a boundary portion between the first region R1 and the second region R2. However, a first interconnect 21 may be further provided between the first region R1 and the second region R2. Adjacent first interconnects 21 at the boundary between the first and second regions may be electrically insulated from each other and may be operated independently with each other.

Figure 5:
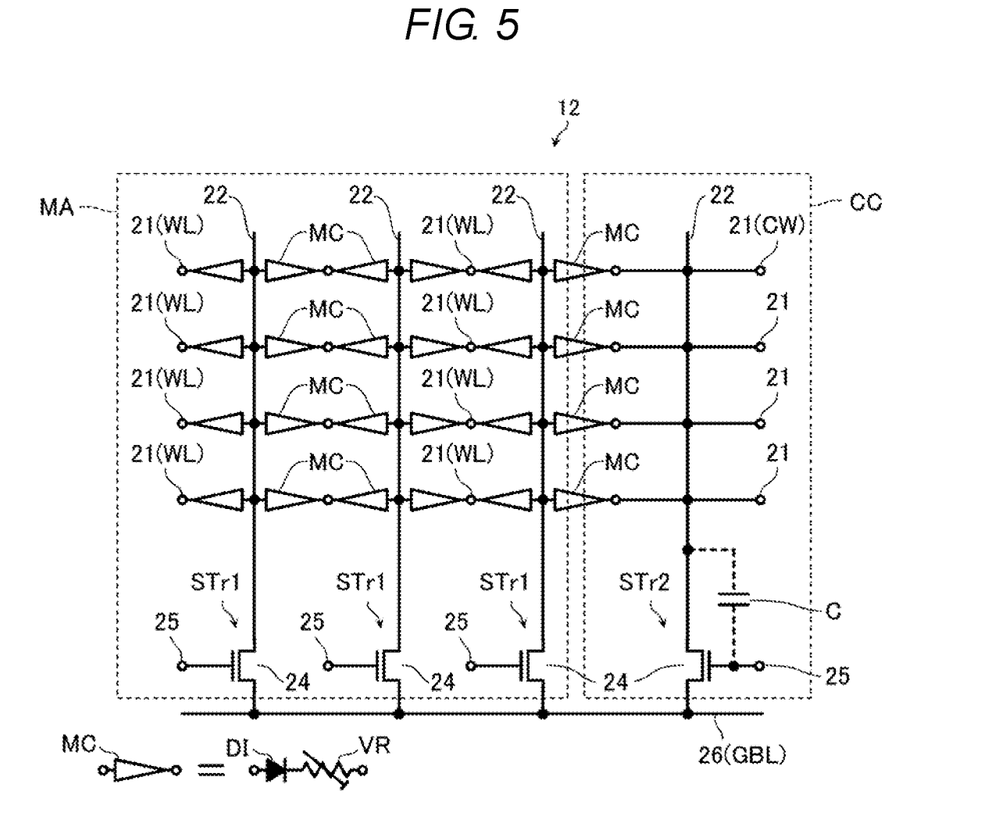
FIG. 5 is a circuit diagram illustrating a configuration of a part of the semiconductor memory device.

FIG. 5 is a circuit diagram illustrating a configuration of a part of the core portion 12 described with reference to FIG. 2, for example.

In the memory cell array MA, the variable resistance layers 23 provided between the plurality of first interconnects 21 and the plurality of second interconnects 22 function as a memory cell MC. Each memory cell MC is connected between a first interconnect 21 and a second interconnect 22. The memory cell MC according to the embodiment has, for example, functions of a resistance-variable element VR and a rectifying element DI connected in series. The memory cell MC stores data of "1" or "0" depending on it having a high resistance state or a low resistance state, for example, and has a rectifying characteristic in a direction in which a current flows from the second interconnect 22 to the first interconnect 21. In addition, the semiconductor layer 24 and the gate electrode 25 provided between the lower ends of the plurality of second interconnects 22 and the third interconnects 26 (global bit line GBL) function as a field-effect transistor in which the semiconductor layer 24 serves as a channel region and the gate electrode 25 serves as a gate electrode. Such a transistor is connected between the second interconnect 22 and the third interconnect 26 (global bit line GBL). Hereinafter, the first interconnect 21 may be referred to as a word line WL, and the second interconnect 22 may be referred to as a local bit line LBL. In addition, the field-effect transistor may be referred to as a first select transistor STr1.

In the charging circuit CC, all of the plurality of first interconnects 21 are electrically connected to the second interconnects 22. Furthermore, the semiconductor layer 24 and the gate electrode 25 provided between the lower ends of the second interconnects 22 and the third interconnects 26 (global bit line GBL) function as a field-effect transistor in which the semiconductor layer 24 serves as a channel region and the gate electrode 25 serves as a gate electrode. The transistor is connected between the second interconnect 22 and the third interconnect 26 (global bit line GBL). In the drawing, a capacitor C indicated between the second interconnect 22 and the gate electrode 25 schematically illustrates an interconnect capacitance of the first interconnect 21 and the second interconnect 22 and a gate capacitance of the transistor including the gate electrode 25. In the charging circuit CC, the first interconnect 21 may be referred to as a charging interconnect CW. In addition, the field-effect transistor may be referred to as a second select transistor STr2.

In the embodiment, a memory cell MC is provided between the second interconnect 22 in the memory cell array MA and the first interconnect 21 in the charging circuit CC. Such a memory cell MC is not used for data recording and is constantly in a high resistance state. Hereinafter, the memory cell MC may be referred to as a "dummy cell".

[Operation]

An operation of the semiconductor memory device according to the embodiment will be described below with reference to FIG. 5 and the like. The semiconductor memory device according to the embodiment performs a first charging operation for charging the capacitor C in the charging circuit CC, a second charging operation for charging the global bit line GBL, and a read operation for reading the data stored in the memory cell MC in the memory cell array MA.

In the first charging operation, for example, a first charging voltage (for example, a ground voltage) is applied to the gate electrode 25 of the second select transistor STr2 which turns off the second select transistor STr2. In this state, a second charging voltage larger than the first charging voltage is applied to the charging interconnect CW from the voltage generation circuit 47 (see FIG. 4), while a predetermined period of time elapses. Thus, the capacitor C becomes charged. The first charging operation may be simultaneously performed for a plurality of charging circuits CC. Further, the first charging operation may be performed in parallel with a read operation or a write operation after the end of the second charging operation. The first charging operation may not be performed.

In the second charging operation, for example, a read voltage is applied to the charging interconnect CW in a state where the first select transistor STr1 is turned off and the second select transistor STr2 is turned on. Thus, charges accumulated in the capacitor C and charges supplied from the charging interconnect CW are supplied to the global bit line GBL, whereby the global bit line GBL is charged and the voltage of the global bit line GBL rises to the read voltage. When the charging is completed, the second select transistor STr2 is turned off. The second charging operation may be performed using one charging circuit CC, or may be performed using the plurality of charging circuits CC commonly connected to the global bit line GBL, for example. In the second charging operation, charging of the global bit line GBL may be performed by applying a voltage to the end of the global bit line GBL together with the charging from the charging circuit CC.

In the read operation, the first select transistor STr1 connected to a selected memory cell MC to be read is turned on and the other first select transistors STr1 and the second select transistor STr2 are turned off. Thus, the global bit line GBL is connected to the selected memory cell MC. In this state, a first voltage (for example, a ground voltage) is applied to a word line WL connected to the selected memory cell MC, and a second voltage (for example, a voltage corresponding to a half of the read voltage) larger than the first voltage is applied to the other word lines WL. When the selected memory cell MC is in a low resistance state, the charges of the global bit line GBL are discharged through the selected memory cell MC and the word line WL, and the voltage of the global bit line GBL lowers to the first voltage. On the other hand, when the selected memory cell MC is in a high resistance state, the charges of the global bit line GBL are not discharged and the voltage of the global bit line GBL remains at the read voltage.

Next, the voltage of the global bit line GBL is read by a sense amplifier (not illustrated). For example, when the voltage of the global bit line GBL is smaller than a threshold value, it is determined that data of "1" is stored in the memory cell MC. Meanwhile, when the voltage of the global bit line GBL is larger than the threshold value, it is determined that data of "0" is stored in the memory cell MC.

[Manufacturing Method]

A method of manufacturing the semiconductor memory device according to the embodiment will be described below with reference to FIGS. 6 to 12. FIGS. 6 to 12 are schematic cross-sectional views used to describe the manufacturing method, and illustrate cross-sections corresponding to a part of the cross-sectional view of FIG. 3.

Figure 6:
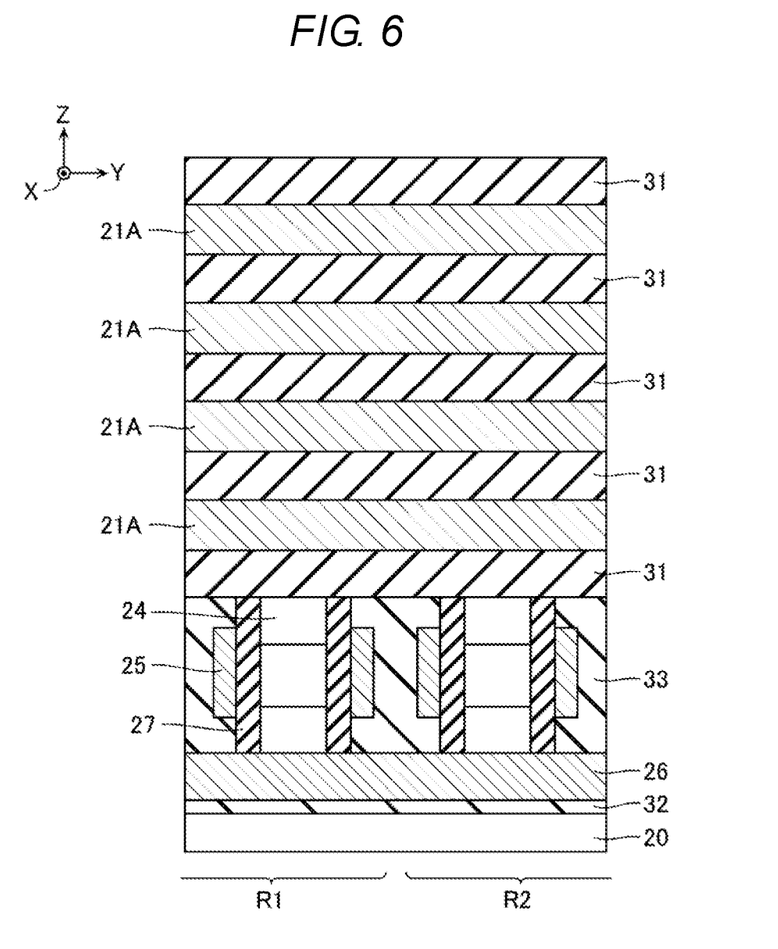
FIG. 6 is a schematic cross-sectional view illustrating a method of manufacturing the semiconductor memory device.

In the manufacturing method, as illustrated in FIG. 6, the interlayer insulating layer 32, the third interconnect 26, the semiconductor layer 24, the gate insulating layer 27, the gate electrode 25, and the interlayer insulating layer 33 are formed on the substrate 20 by a known method. The process is performed by repeated steps of film formation, patterning, and etching using known methods, for example. Next, the interlayer insulating layers 31 and first conductive layers 21A are alternately formed on the semiconductor layer 24 and the interlayer insulating layer 33. The first conductive layer 21A contains, for example, a conductive material such as silicon, tungsten (W), or titanium nitride (TiN). The first conductive layer 21A and the interlayer insulating layer 31 are formed by, for example, a method such as CVD (Chemical Vapor Deposition).

Figure 7:
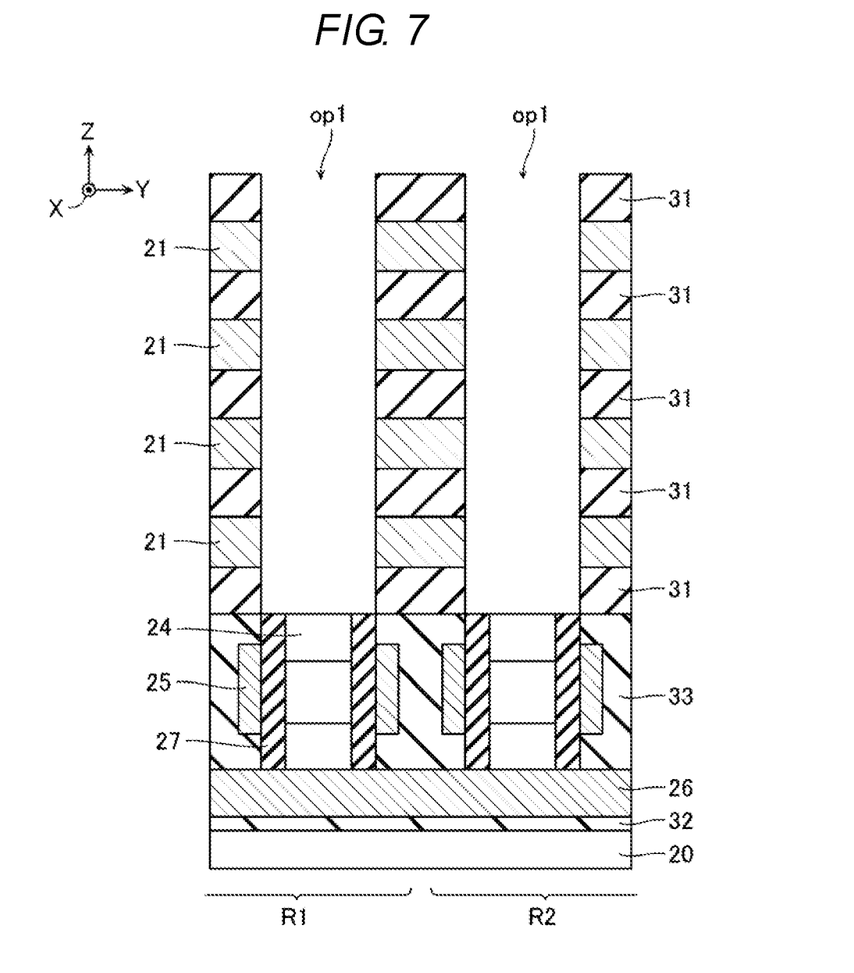
FIG. 7 is a schematic cross-sectional view illustrating the manufacturing method.

Next, as illustrated in FIG. 7, openings op1 are formed in the plurality of first conductive layers 21A and interlayer insulating layers 31. The opening op1 is a groove that extends in the Z direction and the X direction and exposes the upper surface of the semiconductor layer 24. The opening op1 is formed by a method such as RIE (Reactive Ion Etching), for example. As the opening op1 is formed, the plurality of first conductive layers 21A and the interlayer insulating layers 31 are divided in the Y direction. Thus, the plurality of first interconnects 21 are formed.

Figure 8:
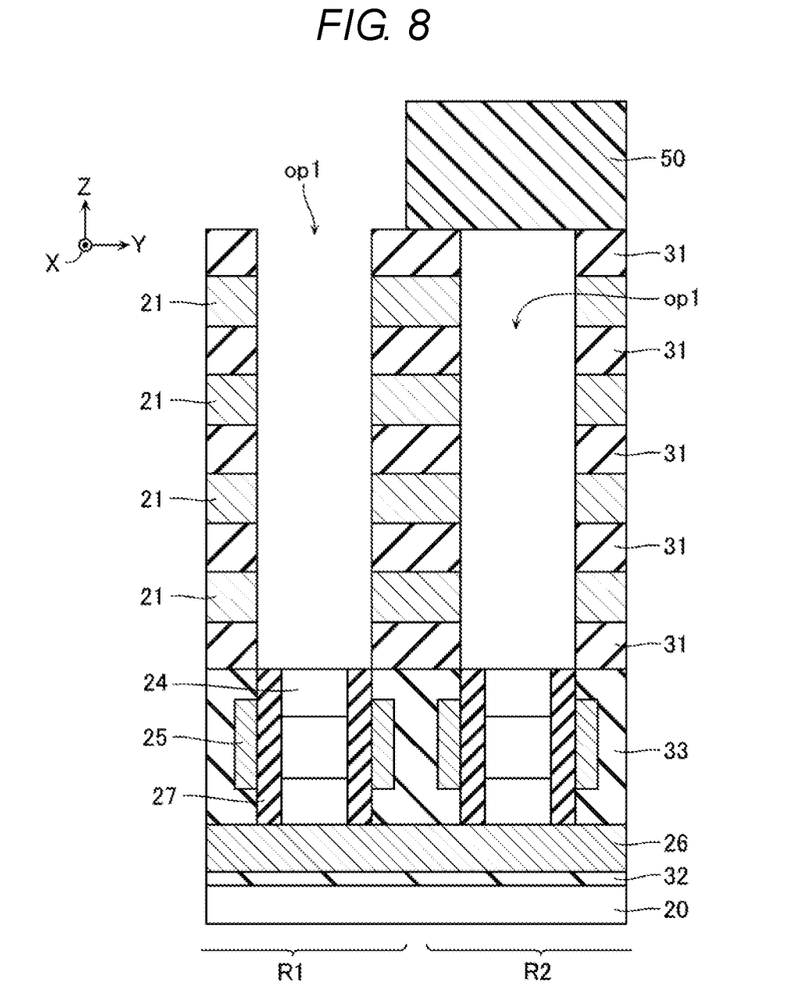
FIG. 8 is a schematic cross-sectional view illustrating the manufacturing method.

Next, as illustrated in FIG. 8, a mask 50 (shown schematically) is formed above the first interconnects 21 and the interlayer insulating layers 31 in the second region R2. The mask 50 is not formed in the first region R1 where the memory cell array MA is formed, and is only formed in the second region R2 where the charging circuit CC is formed. Thus, the opening op1 in the first region R1 is exposed, and the opening op1 in the second region R2 is not exposed.

Figure 9:
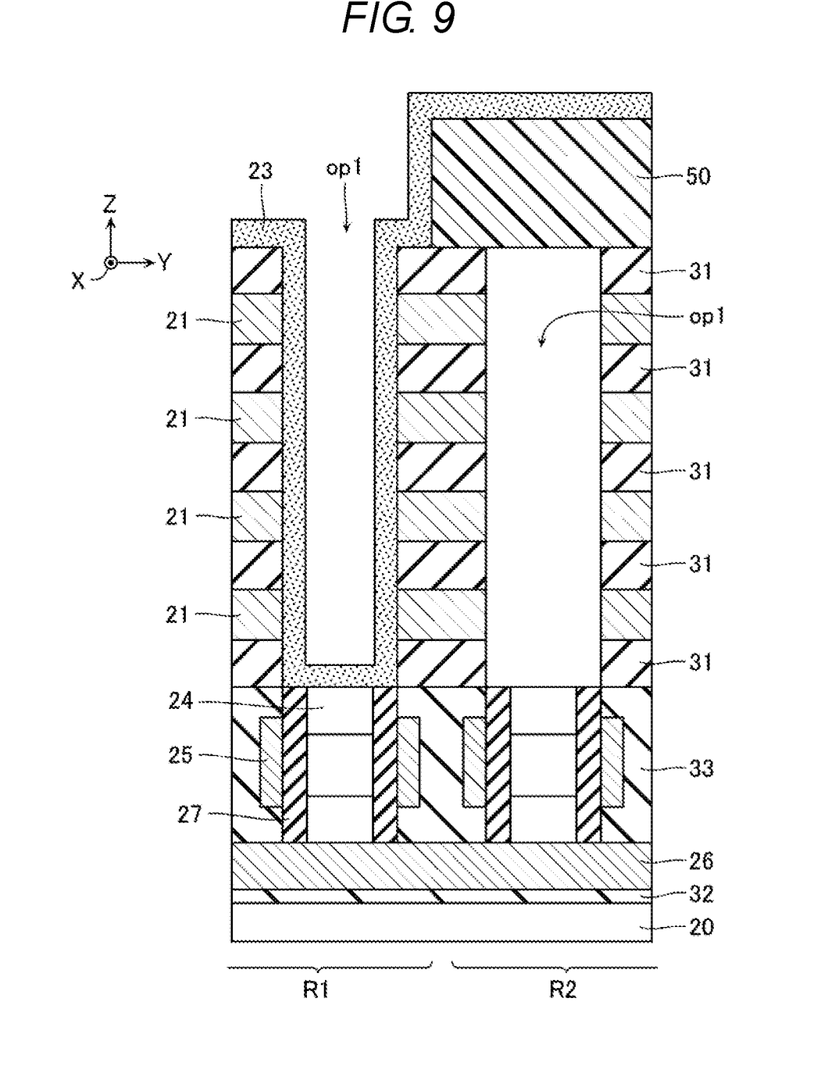
FIG. 9 is a schematic cross-sectional view illustrating the manufacturing method.

Next, as illustrated in FIG. 9, the variable resistance layer 23 is formed in the opening op1. The variable resistance layer 23 is formed by a method such as CVD. Here, the opening op1 in the first region R1 is exposed, i.e., open. Therefore, the variable resistance layer 23 is formed on side walls (side surfaces in the Y direction of the first interconnect 21) and a bottom surface (upper surface of the semiconductor layer 24) of the opening op1. On the other hand, the opening op1 in the second region R2 is not exposed. Therefore, the variable resistance layer 23 is not formed on the side walls and the bottom surface of the opening op1 in the second region R2.

Figure 10:
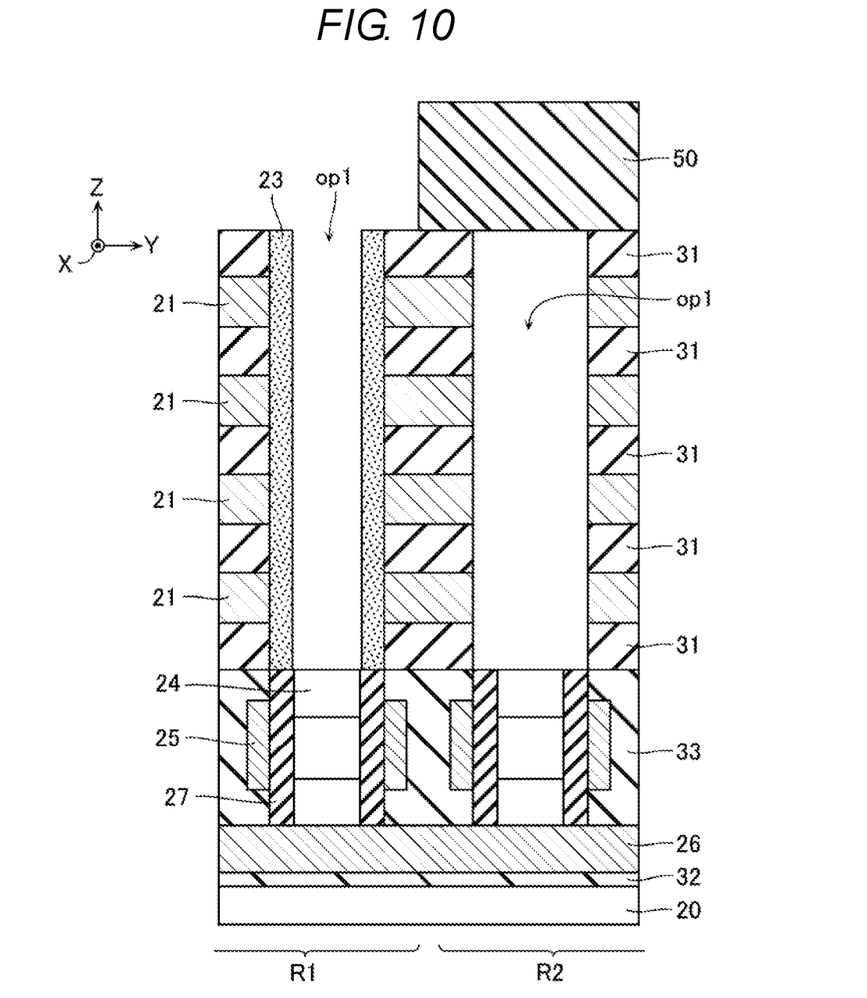
FIG. 10 is a schematic cross-sectional view illustrating the manufacturing method.

Next, as illustrated in FIG. 10, that portion of the variable resistance layer 23 located on the bottom surface of the opening op1 and that portion of the variable resistance layer 23 located on the mask 50 and the upper surface of the uppermost interlayer insulating layer 31 are removed. The process is performed by a method such as RIE.

Figure 11:
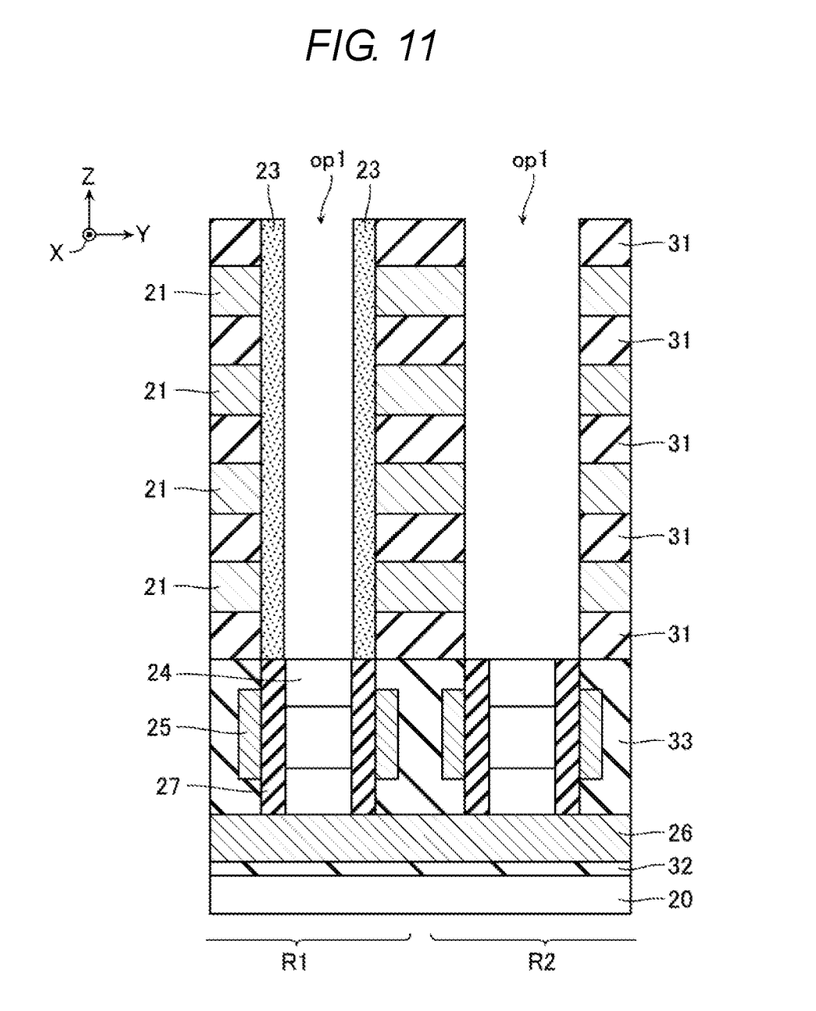
FIG. 11 is a schematic cross-sectional view illustrating the manufacturing method.

Next, as illustrated in FIG. 11, the mask 50 is removed. Thus, the opening op1 in the second region R2 is now exposed.

Figure 12:
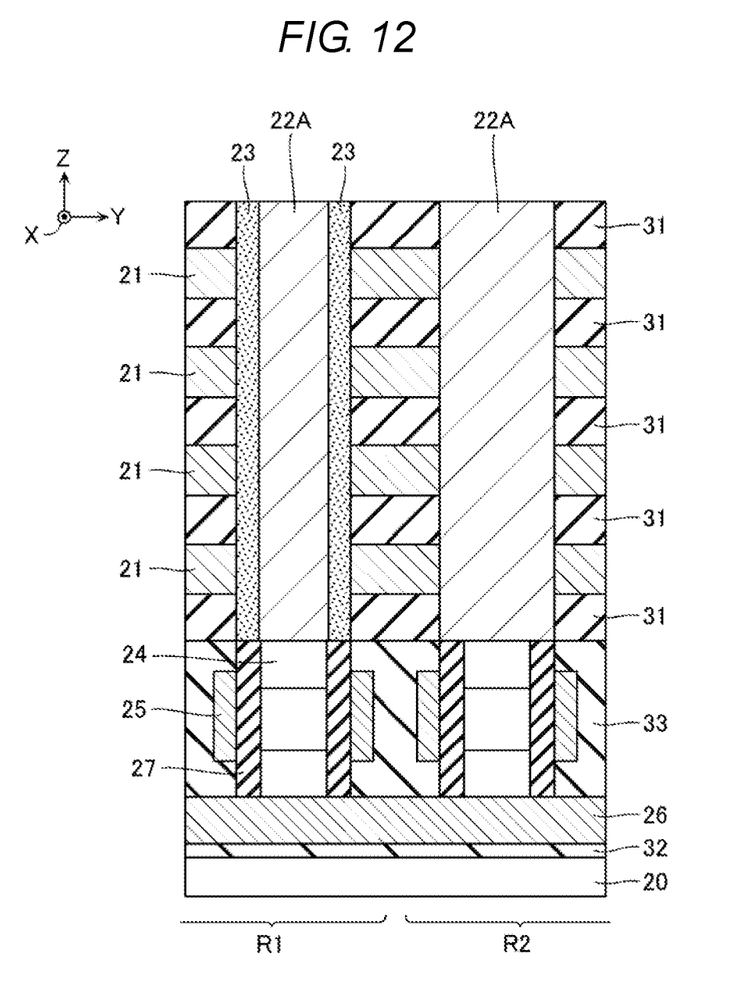
FIG. 12 is a schematic cross-sectional view illustrating the manufacturing method.

Next, as illustrated in FIG. 12, second conductive layer 22A is formed in the openings op1. The second conductive layer 22A contains a conductive material such as silicon, tungsten (W), or titanium nitride (TiN). The second conductive layer 22A is formed by methods of film formation using CVD and etch back using RIE. In the first region R1, the second conductive layer 22A is in contact with the upper surface of the semiconductor layer 24 and the side surfaces of the variable resistance layer 23. In the second region R2, the second conductive layer 22A is in contact with the upper surface of the semiconductor layer 24, the side surfaces of the first interconnect 21, and the side surfaces of the interlayer insulating layer 31.

Thereafter, the second conductive layer 22A is divided in the X direction to form the second interconnect 22. In addition, an operation called "forming" for applying a voltage between the first interconnect 21 and the second interconnect 22 to form a current path (filament) in the variable resistance layer 23 is performed as required. It is not necessary to perform the "forming" on a portion provided between the second interconnect 22 in the memory cell array MA and the first interconnect 21 in the charging circuit CC.

[Effects]

As described with reference to FIG. 1, the global bit lines GBL extend in the Y direction. As the capacitance of the semiconductor memory device increases, it is expected that the global bit lines GBL will be thinned and the load capacitance and the interconnect resistance will be increased accordingly. Thus, when the global bit line GBL is charged only from the end of the global bit line GBL in the Y direction, it is expected that a rapid read operation is unlikely to occur.

As described with reference to FIG. 2, the semiconductor memory device according to the embodiment includes: the plurality of first interconnects 21 arranged in the Z direction and the Y direction; the plurality of second interconnects 22 respectively provided between the first interconnects 21 adjacent to each other in the Y direction and extending in the Z direction; the variable resistance layers 23 provided between the first interconnects 21 and the second interconnects 22; the semiconductor layers 24 connected to one ends of the plurality of second interconnects 22; the plurality of gate electrodes 25 arranged in the Y direction and opposed to the semiconductor layers 24 in the Y direction; and the third interconnects 26 extending in the Y direction and commonly connected to the plurality of semiconductor layers 24. In addition, the variable resistance layer 23 is provided between one second interconnect 22 and one first interconnect 21, and the variable resistance layer 23 is not provided between the other second interconnects 22 and the other first interconnects 21.

In such a configuration, it is possible to charge the third interconnect 26 (global bit line GBL) via the other first interconnects 21, that is, the first interconnects 21 (charging interconnects CW) in the charging circuit CC. Therefore, the global bit line GBL can be charged at a location other than the end thereof in the Y direction, and the read operation can be quickly performed.

Further, such a configuration can be achieved by simply adding the process of forming the mask 50 described with reference to FIG. 8 and the process of removing the mask 50 described with reference to FIG. 11 to the existing manufacturing method. That is, such a configuration can be easily achieved.

In the embodiment, the plurality of charging circuits CC are provided along the global bit lines GBL. Thus, the read operation can be further quickly performed.

In the embodiment, all the interconnects functioning as the word line WL and the charging interconnect CW are referred to as the first interconnect, all the interconnects functioning as the local bit line LBL are referred to as the second interconnect, all the interconnects functioning as the global bit line GBL are referred to as the third interconnect. However, these given names are merely for convenience of description. For example, the interconnects functioning as the word line WL and the charging interconnect CW may be called separately from the first interconnect, the second interconnect, and the third interconnect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a substrate;
a stacked body comprising a plurality of first conductors extending in a first direction away from a surface of the substrate, the first conductors spaced from one another in a second direction intersecting the first direction and a third direction intersecting the first and the second directions, the stacked body comprising a first region and a second region spaced from one another in the third direction;
a plurality of second conductors extending in the second direction and spaced from one another in the first and third directions;
a plurality of third conductors extending in the third direction and spaced from one another in the first direction, each third conductor connected to a first end, in the second direction, of the plurality of second conductors in the first region;
a plurality of fourth conductors extending in the first direction and spaced from one another in the second direction, each fourth conductor connected to the plurality of second conductors in the second region; and
memory cells located between adjacent surfaces of the first and second conductors in the first region.

2. The semiconductor memory device of claim 1, further comprising:
a voltage generation circuit connected to the uppermost fourth conductor of the stacked body in the second region.

3. The semiconductor memory device of claim 1, further comprising:
a plurality of fifth conductors extending in the third direction and spaced from one another in the first direction, each fifth conductor connected to the first conductors in the first region.

4. The semiconductor memory device of claim 3, wherein the stacked body comprises N second conductors, where N is a whole number, and the number of first conductors is N.

5. The semiconductor memory device according to claim 4, wherein
a first one of the first conductors is connected to one of the fifth conductors; and
a second one and a third one of the first conductors on both sides of the first one in the third direction are connected to another of the fifth conductors.

6. The semiconductor memory device according to claim 1, wherein a second end of the second conductors in the second direction, opposed to the first end thereof, are electrically insulated from one another.

7. The semiconductor memory device according to claim 1, wherein the memory cells include a variable resistance layer located between adjacent surfaces of the first and second conductors in the first region.

8. The semiconductor memory device according to claim 1, wherein second conductors extend between the first conductors closest to the second region in the first region and the first conductors closest to the first region in the second region.

9. The semiconductor memory device according to claim 1, further comprising:
  a semiconductor layer connected between each of the plurality of third conductors and the first end of each of the plurality of second conductors; and
  a plurality of gate electrodes spaced from one another in the third direction and facing the semiconductor layers.

\* \* \* \* \*